United States Patent
Cao et al.

(10) Patent No.: US 12,512,392 B2
(45) Date of Patent: Dec. 30, 2025

(54) PACKAGE STRUCTURE FOR REDUCING WARPAGE OF PLASTIC PACKAGE WAFER AND METHOD FOR MANUFACTURING THE SAME

(71) Applicants: NATIONAL CENTER FOR ADVANCED PACKAGING CO., LTD, Suzhou (CN); SHANGHAI XIANFANG SEMICONDUCTOR CO., LTD, Shanghai (CN)

(72) Inventors: Liqiang Cao, Suzhou (CN); Cheng Xu, Suzhou (CN); Peng Sun, Suzhou (CN); Fei Geng, Suzhou (CN)

(73) Assignees: NATIONAL CENTER FOR ADVANCED PACKAGING CO., LTD, Jiangsu (CN); SHANGHAI XIANFENG SEMICONDUCTOR CO., LTD, Shanghai (CN)

( * ) Notice: Subject to any disclaimer, the term of this patent is extended or adjusted under 35 U.S.C. 154(b) by 371 days.

(21) Appl. No.: 18/270,840

(22) PCT Filed: Mar. 5, 2021

(86) PCT No.: PCT/CN2021/079256
§ 371 (c)(1),
(2) Date: Jul. 4, 2023

(87) PCT Pub. No.: WO2022/151572
PCT Pub. Date: Jul. 21, 2022

(65) Prior Publication Data
US 2024/0071873 A1 Feb. 29, 2024

(30) Foreign Application Priority Data
Jan. 18, 2021 (CN) .......................... 202110063190.1

(51) Int. Cl.
| | | |
|---|---|---|
| H01L 23/48 | (2006.01) | |
| H01L 21/768 | (2006.01) | |
| H01L 23/00 | (2006.01) | |

(52) U.S. Cl.
CPC ...... *H01L 23/481* (2013.01); *H01L 21/76898* (2013.01); *H01L 23/562* (2013.01);
(Continued)

(58) Field of Classification Search
CPC .................................................... H01L 23/481
See application file for complete search history.

(56) References Cited

U.S. PATENT DOCUMENTS

2013/0203215 A1* 8/2013 Hung ............... H01L 21/78
438/107
2014/0175665 A1* 6/2014 Kang ............... H01L 23/147
257/774

(Continued)

FOREIGN PATENT DOCUMENTS

| CN | 103346097 | 10/2013 |
|---|---|---|
| CN | 104810332 | 7/2015 |

(Continued)

OTHER PUBLICATIONS

"International Search Report (Form PCT/ISA/210) of PCT/CN2021/079256", mailed on Oct. 26, 2021, with English translation thereof, pp. 1-6.

*Primary Examiner* — William A Harriston
(74) *Attorney, Agent, or Firm* — JCIPRNET

(57) ABSTRACT

The present invention discloses a package structure for reducing warpage of plastic package wafer, including an adapter board, a chip mounted on the adapter board, and a first plastic package layer covering the chip, through-silicon-vias are disposed on the adapter board, the first and second surfaces of the adapter board are respectively provided with external connection solder balls and/or external connection (Continued)

solder pads electrically connected with the through-silicon-vias. The process of manufacturing the package structure includes: after the first surface process of the adapter board is completed, bonding the first carrier on its first surface, then cutting the first carrier to expose the chip-mounting area, and then carrying out subsequent processes such as chip mounting, and finally cutting and removing the first carrier to complete the package.

7 Claims, 3 Drawing Sheets

(52) U.S. Cl.
CPC .............. *H01L 24/03* (2013.01); *H01L 24/11* (2013.01); *H01L 24/13* (2013.01); *H01L 2224/02333* (2013.01); *H01L 2224/031* (2013.01); *H01L 2224/111* (2013.01); *H01L 2224/13008* (2013.01); *H01L 2924/3511* (2013.01)

(56) References Cited

U.S. PATENT DOCUMENTS

| | | | |
|---|---|---|---|
| 2015/0048503 | A1 | 2/2015 | Chiu et al. |
| 2020/0395313 | A1* | 12/2020 | Mallik .................. H01L 21/565 |

FOREIGN PATENT DOCUMENTS

| | | |
|---|---|---|
| CN | 105428331 | 3/2016 |
| CN | 109037181 | 12/2018 |
| CN | 111128914 | 5/2020 |
| CN | 112117236 | 12/2020 |
| JP | 2001352007 | 12/2001 |
| JP | 2020202218 | 12/2020 |

* cited by examiner

PACKAGE STRUCTURE FOR REDUCING WARPAGE OF PLASTIC PACKAGE WAFER AND METHOD FOR MANUFACTURING THE SAME

CROSS-REFERENCE TO RELATED APPLICATION

This application is a 371 application of the international PCT application serial no. PCT/CN2021/079256, filed on Mar. 5, 2021, which claims the priority benefit of China application no. 202110063190.1, filed on Jan. 18, 2021. The entirety of each of the above-mentioned patent applications is hereby incorporated by reference herein and made a part of this specification.

BACKGROUND

Technical Field

The present invention relates to the field of semiconductor technology, and in particular to a package structure for reducing warpage of plastic package wafer and a manufacturing method thereof.

Description of Related Art

With the development of semiconductor technology, the size of integrated circuits continues to decrease, and people have higher and higher requirements on the packaging of integrated circuits.

With the reduction of the thickness of the chip, the amount of grinding for the wafer during the packaging process is increasing, which makes the hardness of the wafer itself decrease while the stress is greater, making the warpage of the wafer more and more severe. Warpage will bring the risk of fragments and scratches to chip manufacturing and may even lead to parameter drift.

Therefore, the effective control of wafer warpage helps improve the reliability of the package.

SUMMARY

Aiming at some or all of the problems in the prior art, one aspect of the present invention provides a package structure for reducing warpage of plastic package wafer, comprising:

An adapter board, on its first surface, a first redistribution layer being arranged, and on the second surface, external connection solder balls being arranged;

A chip, having a second surface comprising solder pads, the solder pads being electrically connected to the first redistribution layer; and A plastic package layer, covering the chip but exposing the first surface of the chip.

Furthermore, the chip comprises a plurality of identical, same-type, or different chips.

Furthermore, an underfill material is disposed between the chip and the first redistribution layer.

Another aspect of the present invention provides a method of manufacturing the package structure, comprising:

Forming through-silicon-vias and the first redistribution layer on the first surface of the silicon chip to obtain the initial adapter board;

Bonding a first carrier to the initial adapter board;

Cutting the first carrier to expose the chip-mounting area of the initial adapter board;

Mounting the chip onto the first surface of the initial adapter board, wherein the solder pads of the chip are electrically connected with the first redistribution layer;

Forming a plastic package layer; Thinning the plastic package layer to expose the first surface of the chip;

Thinning the second surface of the initial adapter board to expose the through-silicon-vias;

Forming, on the second surface of the initial adapter board, a second redistribution layer and external connection solder balls electrically connected to the through-silicon-vias; Removing the first carrier; and Cut to form a single package structure.

Furthermore, the first surface of the first carrier includes a photolithographic pattern, and the photolithographic pattern is matched with the non-chip-mounting area of the initial adapter board.

Furthermore, the coefficient of thermal expansion of the material of the first carrier is the same as or close to that of silicon.

Furthermore, the surface of the photolithographic pattern is coated with a bonding material.

Furthermore, the bonding material is coated on the surface of the photoetching pattern through a glue rolling process.

Furthermore, removing of the first carrier comprises:

Cutting along the edge of the plastic package layer, to cut off the first carrier and the non-chip-mounting area of the adapter board.

Furthermore, the manufacturing method further comprises:

Bonding a second carrier on the first surface of the chip prior to operation of exposing the through-silicon-vias, and removing the second carrier prior to removal of the first carrier.

The invention provides a package structure for reducing warpage of plastic package wafer and a manufacturing method thereof, before the wafer is subjected to plastic package, a material such as silicon wafer or glass, with a coefficient of thermal expansion close to that of silicon, is mounted in the non-chip-mounting area, thus reducing the proportion of a plastic package material in a plastic package process during plastic package and reducing warpage. In addition, due to the plastic package area being smaller than the wafer size, the used amount of the plastic package material is also reduced; after plastic package thinning, the gap between the chips and the gap with the edge protection area are mainly filled by the plastic package material, and because materials such as silicon and the like are used as the edge filling materials, the edges of the chips can be used for wafer alignment after a process required after the plastic package, so that the subsequent process is convenient to carry out.

BRIEF DESCRIPTION OF THE DRAWINGS

To further explain the above and other advantages and features of various embodiments of the present invention, more specific description of various embodiments of the present invention will be provided with reference to the accompanying drawings. It can be understood that these accompanying drawings depict only typical embodiments of the present invention, and therefore will not be considered as limiting their scope. In the accompanying drawings, identical or corresponding parts will be indicated by the same or similar reference numerals for the sake of clarity.

DESCRIPTION OF THE EMBODIMENTS

In the following description, the present invention is described with reference to various embodiments. However, those skilled in the art will recognize that various embodiments can be implemented without one or more specific details or with other alternative and/or additional methods, materials, or components. In other situations, well-known structures, materials, or operations are not shown or described in detail so as not to obscure the inventive point of the present invention. Similarly, for the purpose of explanation, specific quantities, materials, and configurations are set forth in order to provide a comprehensive understanding of embodiments of the present invention. However, the present invention is not limited to these particular details. Furthermore, it should be understood that the embodiments illustrated in the accompanying drawings are illustrative representations and are not necessarily drawn to the correct scale.

In this specification, a reference to "one embodiment" or "the embodiment" means that particular feature, structure or characteristic described in connection with the embodiment are included in at least one embodiment of the present invention. The phrase "in one embodiment" appearing throughout this description may not necessarily all referring to the same embodiment.

It should be noted that the embodiments of the present invention describe the process steps in a specific order, however this is only for the purpose of illustrating the specific embodiment, rather than limiting the order of the steps. On the contrary, in different embodiments of the present invention, the order of the steps can be modified according to the adjustment of the process.

Aiming at the problem of significant warpage in the process of the existing packaging technology, the present invention mount materials, such as silicon wafers or glass, with the coefficient of thermal expansion similar to silicon, in the non-chip-mounting area before wafer packaging to reduce warpage and reduce the use of plastic package materials. The specific scheme of the present invention will be further described below in conjunction with the accompanying drawings of the embodiments.

Figure 3A:
FIGS. 3a-3m illustrate a schematic diagram of cross-section of a process for forming a package structure for reducing warpage of plastic package wafer according to an embodiment of the present invention.
Figure 3B:
Figure 3C:
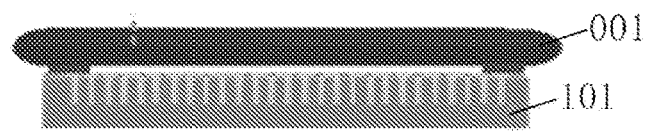
Figure 3D:
Figure 3E:
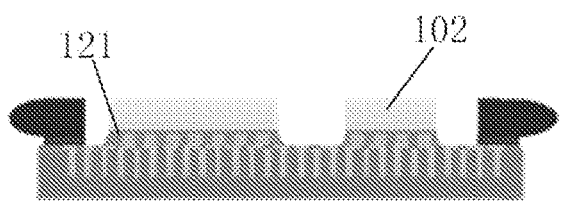
Figure 3F:
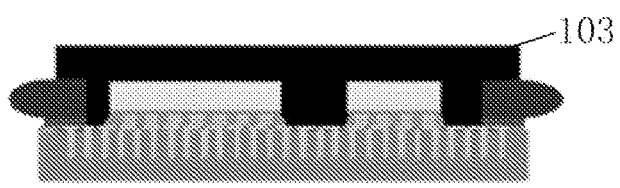
Figure 3G:
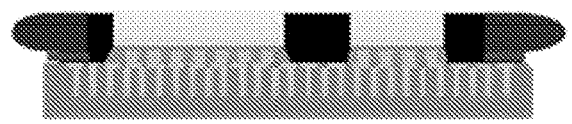
Figure 3H:
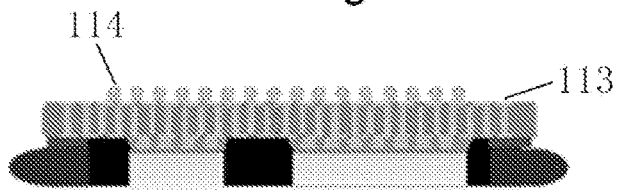
Figure 3I:

FIG. 2 and FIGS. 3a-3i illustrate a flow chart and a process cross-sectional schematic diagram, respectively, for forming a package structure according to an embodiment of the present invention. As shown in the figure, a method of manufacturing a package structure comprising:

First, at step 201, as shown in FIG. 3a, an initial adapter board is formed. The formation of the initial adapter board 101 comprises:

Forming through-silicon-vias 111 on the first surface of the silicon wafer, the through-silicon-vias 111 does not penetrate through the silicon wafer and remains a certain distance from the second surface of the silicon wafer 101, the through-silicon-vias 111 can be formed through photolithography and etching process;

Depositing a passivation layer or performing direct thermal oxidation on the surface of the through-silicon-vias 111. In one embodiment of the present invention, the material of the passivation layer is silicon oxide or silicon nitride, etc.;

Manufacturing a seed layer above the passivation layer by physical sputtering, magnetron sputtering or evaporating deposition process, the seed layer may be made of titanium, copper, aluminum, silver, gold, palladium, thallium, tin, nickel and other metals;

Electroplating filler metal in the through-silicon-vias, the metal may be copper metal; and Removing the insulation layer on the surface of the silicon wafer using dry etching or wet etching process, so as to expose the filled metal to form the initial adapter board;

In one embodiment of the present invention, a first redistribution layer 112 may also be formed on the first surface of the silicon wafer, making it electrically connected to the through-silicon-vias 111;

Next, at step 202, as shown in FIG. 3b, a first carrier is made. According to the non-chip-mounting area on the first surface of the initial adapter board 101, a photolithographic pattern 011 is formed on the first surface of the first carrier 001 by a photolithographic process, so as to avoid blocking the chip-mounting area when bonding the first carrier 001 to the initial adapter board 101, in one embodiment of the present invention, the material of the first carrier is chosen to be material with an coefficient of thermal expansion close or identical to of silicon, such as glass, silicon, etc. In order to bond the first carrier 001 to the initial adapter board, a bonding material is coated on the surface of the photolithographic pattern through processes such as glue rolling;

Next, at step 203, as shown in FIG. 3c, the first carrier is bonded. The first carrier 001 is bonded to the non-chip-mounting area of the initial adapter board 101, due to the presence of the lithographic pattern 011 and the bonding material, there is a certain gap between the first carrier 001 and the chip-mounting area of the initial adapter board 101;

Next, at step 204, as shown in FIG. 3d, the first carrier is cut. The first carrier 001 is cut to expose the chip-mounting area of the initial adapter board 101, in one embodiment of the present invention, the first carrier 001 can be cut by laser, and the cutting depth can be set in laser cutting, and since there is a certain gap between the first carrier 001 and the chip-mounting area of the initial adapter board 101, as long as a suitable cutting depth is set, damage to the chip-mounting area can be avoided;

Next, at step 205, as shown in FIG. 3e, the chip is mounted. The chip 102 is mounted to the chip-mounting area on the first surface of the initial adapter board 101, so that the solder pads of the chip 102 are electrically connected with the first redistribution layer 112 or through-silicon-vias 111; in one embodiment of the present invention, after the mounting is completed, the underfill material 121 is filled in the gap between the chip 102 and the initial adapter board 101; in one embodiment of the present invention, the chip may be a logic chip such as CPU, DSP, GPU, FPGA, etc., or a storage chip such as DRAM, Flash, etc., or other types of chips such as SOC or sensors (e.g., MEMS sensors, etc.), and a package structure may contain one or more identical, same-type or different chips;

Next, at step 206, as shown in FIG. 3f, a plastic package layer is formed. The plastic package layer 103 covers the chip 102; in one embodiment of the present invention, the material of the plastic package layer 103 may be a resin material, etc.;

Next, at step 207, as shown in FIG. 3g, the plastic package layer is thinned. The plastic package layer 103 is thinned by grinding, so that the first surface of the chip 102 is exposed;

Next, at step 208, as shown in FIG. 3h, external connection solder balls are formed. The second surface of the initial adapter board 101 is thinned so as to expose the through-silicon-vias 111, and then an electroplating seed layer is formed on the second surface of the initial adapter board 101. The specific formation method can be achieved through processes such as chemical plating and PVD, etc. In a specific embodiment of the present invention, the electroplating seed layer may be formed by depositing a layer of chromium of 200-1000 Å and a layer of copper of 500-3000 Å be formed, and then a second redistribution layer 113 is formed by patterned electroplating on the electroplating seed layer, so that the second redistribution layer 113 is electrically connected with the through-silicon-vias, and the specific patterned electroplating method further includes steps such as gluing, drying, lithography, developing, electroplating, and removing glue, etc. In one embodiment of the present invention, external connection solder balls 114 may also be formed on the external connection solder pads of the second redistribution layer 113 by processes such as of ball planting, electroplating, etc.;

Next, at step 209, as shown in FIG. 3i, the first carrier is removed. Cut is performed along the edges of the plastic package layer 103 to remove the first carrier 001 and the non-chip-mounting area of the adapter board; and Finally, at step 210, a single package structure is formed by cutting.

Figure 3J:
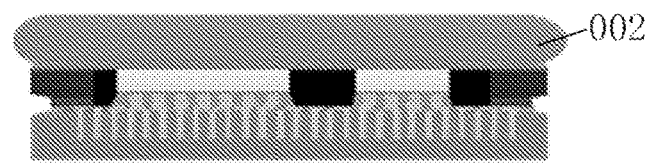
Figure 3K:
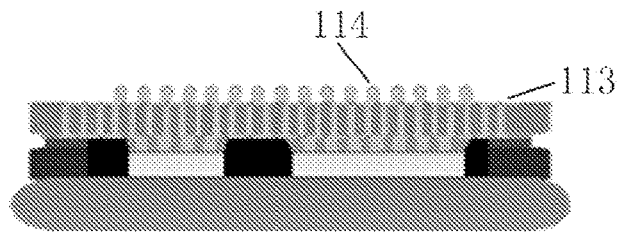
Figure 3L:
Figure 3M:

FIGS. 3j to 3m illustrate another process for the formation of external connection solder balls. After the plastic package layer is thinned, if the stress on the front and back sides is unbalanced, or the integral stiffness is too large, a bonding scheme can be selected to complete the relevant process, including:

First, as shown in FIG. 3j, a second carrier is bonded. Bonding a second carrier plate 002 on the first surface of the chip 102, wherein the second carrier plate 002 may be a carrier plate material such as wafer, glass, etc., and it is bonded to the first surface of the chip by an adhesive material, the size of the second carrier plate is not smaller than the initial adapter board, and the adhesive material is a bonding adhesive material detachable by such as heating, lighting, etc.;

Next, as shown in FIG. 3k, external connection solder balls are formed. The second surface of the initial adapter board 101 is thinned so as to expose the through-silicon-vias 111, and then an electroplating seed layer is formed on the second surface of the initial adapter board 101. The specific formation method can be achieved through processes such as chemical plating and PVD, etc. In a specific embodiment of the present invention, the electroplating seed layer may be formed by depositing a layer of chromium of 200-1000 Å and a layer of copper of 500-3000 ed through processes such as redistribution layer 113 is formed by patterned electroplating on the electroplating seed layer, so that the second redistribution layer 113 is electrically connected with the through-silicon-vias, and the specific patterned electroplating method further includes steps such as gluing, drying, lithography, developing, electroplating, and removing glue, etc.; In one embodiment of the present invention, external connection solder balls 114 may also be formed on the external connection solder pads of the second redistribution layer 113 by processes such as of ball planting, electroplating, etc.;

Next, as shown in FIG. 3l, the second carrier is removed. The specific removal method can be achieved by heating debonding, laser irradiation debonding, etc., based on the characteristics of the adhesive material, and further cleaning processes can be used to completely remove the adhesive material; and Finally, as shown in FIG. 3m, the first carrier is removed. Cut is performed along the edges of the plastic package layer 103 to remove the first carrier 001 and the non-chip-mounting area of the adapter board.

Figure 1:
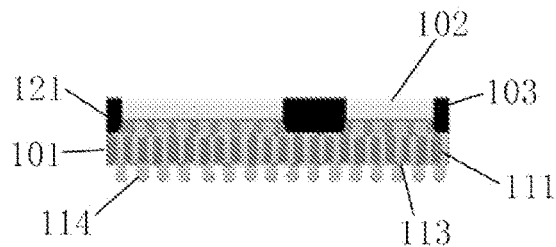
FIG. 1 illustrates a structural schematic diagram of a package structure for reducing warpage of plastic package wafer according to an embodiment of the present invention.
Figure 2:
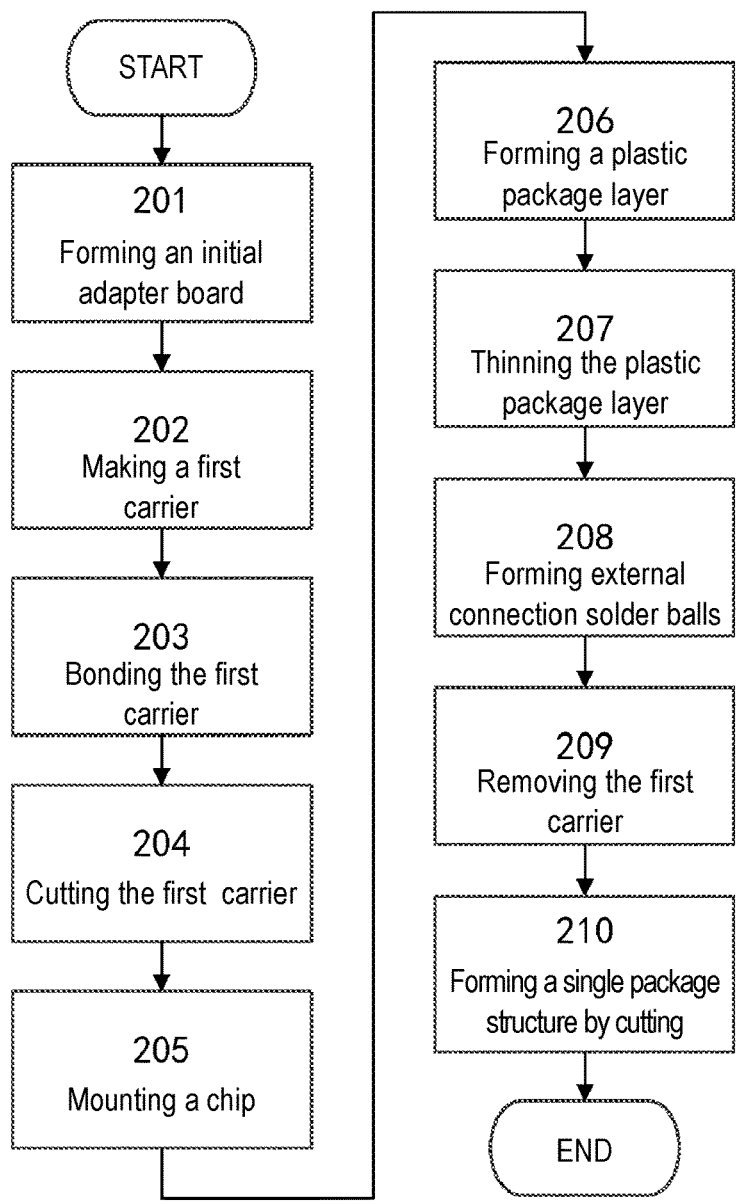
FIG. 2 illustrates a process flow schematic diagram of a method of manufacturing a package structure for reducing warpage of plastic package wafer according to an embodiment of the present invention.

The finally formed package structure is shown in FIG. 1 and includes: an adapter board 101, a chip 102 and a plastic package layer 103. Wherein the chip 102 is mounted on the first surface of the adapter board 101 and is electrically connected with the through-silicon-vias 111 on the adapter board 101. In one embodiment of the present invention, underfill material 121 is filled between the chip 102 and the adapter board 101. In one embodiment of the present invention, the chip 102 is electrically connected with the through-silicon-vias 111 through a first redistribution layer, and the second surface of the adapter board includes external connection solder balls, so that the package can be mounted on the substrate, wherein the external connection solder balls 114 are arranged on external connection solder pads of the second redistribution layer 113, the second redistribution layer 113 is formed on the second surface of the adapter board 101, and electrically connected with the through-silicon-vias 111, and the convex points are formed by thinning the adapter board, so that the through-silicon-vias are exposed. The plastic package layer 103 covers the chip 102, but exposes the first surface of the chip 102.

The invention provides a package structure for reducing warpage of plastic package wafer and a manufacturing method thereof, before the wafer is subjected to plastic package, a material with a coefficient of thermal expansion close to that of silicon, such as silicon wafer or glass, is mounted in the non-mounting area, reducing the proportion of a plastic package material in a plastic package process during plastic package and reducing warpage. In addition, due to the plastic package area being smaller than the wafer size, the used amount of the plastic package material is also reduced; after plastic package is thinned, the gap between the chips and the gap with the edge protection area are mainly filled by the plastic package material, and because materials such as silicon and the like are used as the edge filling materials, the edges of the chips can be used for wafer alignment after a process required after the plastic package, so that the subsequent process is convenient to carry out.

Although the various embodiments of the present invention have been described above, however, it should be understood that they are presented only as examples and not as limitations. It will be apparent to those skilled in the relevant art that various combinations, variations and changes can be made thereto without departing from the spirit and scope of the present invention. Therefore, the width and scope of the present invention disclosed herein should not be limited by the exemplary embodiments disclosed above, but should only be defined based on the accompanying claims and their equivalents.

What is claimed is:

1. A method of manufacturing a package structure for reducing warpage of a plastic package wafer, comprising:
   forming through-silicon-vias and a first redistribution layer on a first surface of the silicon chip to obtain an initial adapter board;
   bonding a first carrier onto the initial adapter board;
   cutting the first carrier to expose a chip-mounting area of the initial adapter board;
   mounting a chip onto the first surface of the initial adapter board, wherein solder pads of the chip are electrically connected with the first redistribution layer;
   forming a plastic package layer;
   thinning the plastic package layer to expose a first surface of the chip;
   thinning a second surface of the initial adapter board to expose the through-silicon-vias;
   forming, on the second surface of the initial adapter board, a second redistribution layer and external connection solder balls electrically connected to the through-silicon-vias;
   removing the first carrier; and
   cutting to form a single package structure.

2. The method of manufacturing the package structure for reducing warpage of the plastic package wafer according to claim 1, wherein a first surface of the first carrier includes a photolithographic pattern, and the photolithographic pattern corresponds to a non-chip-mounting area of the initial adapter board.

3. The method of manufacturing the package structure for reducing warpage of the plastic package wafer according to claim 2, wherein a surface of the photolithographic pattern is coated with a bonding material.

4. The method of manufacturing the package structure for reducing warpage of the plastic package wafer according to claim 3, wherein the bonding material is coated on the surface of the photoetching pattern through a glue rolling process.

5. The method of manufacturing the package structure for reducing warpage of the plastic package wafer according to claim 1, wherein a coefficient of thermal expansion of a material of the first carrier is the same as or close to a coefficient of thermal expansion of silicon.

6. The method of manufacturing the package structure for reducing warpage of the plastic package wafer according to claim 1, wherein removing the first carrier comprises:
   cutting along an edge of the plastic package layer, to cut off the first carrier and a non-chip-mounting area of the adapter board.

7. The method of manufacturing the package structure for reducing warpage of the plastic package wafer according to claim 1, further comprising:
   bonding a second carrier on the first surface of the chip prior to operation of exposing the through-silicon-vias, and removing the second carrier prior to removal of the first carrier.

* * * * *